United States Patent
Behzad

(10) Patent No.: US 7,415,286 B2
(45) Date of Patent: Aug. 19, 2008

(54) GAIN BOOSTING FOR LOCAL OSCILLATION DISTRIBUTION CIRCUITRY

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 486 days.

(21) Appl. No.: 11/284,203

(22) Filed: Nov. 21, 2005

(65) Prior Publication Data

US 2006/0229039 A1 Oct. 12, 2006

Related U.S. Application Data

(63) Continuation-in-part of application No. 11/167,358, filed on Jun. 27, 2005.

(60) Provisional application No. 60/669,722, filed on Apr. 8, 2005.

(51) Int. Cl.
*H04M 1/00* (2006.01)
(52) U.S. Cl. .............. 455/553.1; 455/127.1; 455/232.1; 455/333; 330/252
(58) Field of Classification Search ............. 455/114.2, 455/127.1, 127.2, 232.1, 552.1, 553.1, 333, 455/41.1, 41.2; 370/908; 330/67, 177, 252, 330/253, 254
See application file for complete search history.

(56) References Cited

U.S. PATENT DOCUMENTS

| 4,291,246 A | * | 9/1981 | Martino et al. ................. 326/70 |
| 6,414,517 B1 | * | 7/2002 | Kim et al. ...................... 326/88 |
| 7,015,870 B2 | * | 3/2006 | Guitton et al. .............. 343/860 |
| 2002/0049046 A1 | * | 4/2002 | Audinot ...................... 455/255 |
| 2005/0124377 A1 | * | 6/2005 | Shih et al. ................. 455/552.1 |

* cited by examiner

*Primary Examiner*—Quochien B Vuong
(74) *Attorney, Agent, or Firm*—Garlick Harrison & Markison; James A. Harrison

(57) ABSTRACT

A multi-band integrated circuit radio transceiver comprising receive and transmit radio front end circuit blocks further includes a local oscillation generator for generating a local oscillation for use by the receive and transmit radio front end circuit blocks to down convert received RF signals to baseband or low intermediate frequency signals and for use by the transmit front end circuit blocks to up-convert outgoing communication signals to RF, respectively. The transceiver further includes at least one buffering element coupled disposed in the local oscillation path that produces a buffered oscillation based upon the local oscillation to at least one front end circuit block wherein the buffering element includes a differentially arranged amplifier stage having a load and a cross-coupled capacitive element coupled between input and output nodes of the amplifier stage and at least one of an inductive device or a selectable capacitive device.

20 Claims, 8 Drawing Sheets

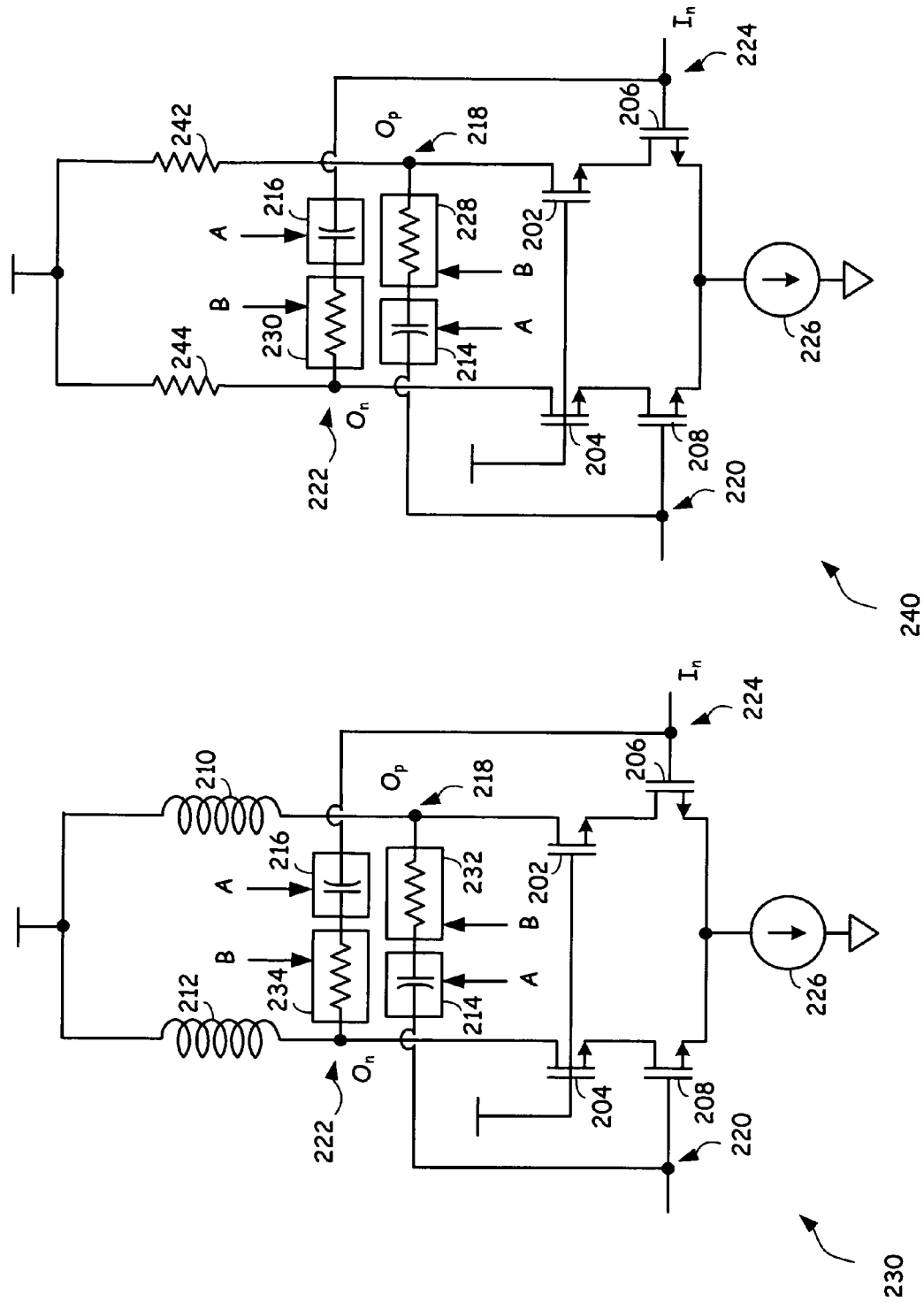

GAIN BOOSTING FOR LOCAL OSCILLATION DISTRIBUTION CIRCUITRY

CROSS REFERENCE TO RELATED APPLICATIONS

This application claims priority to U.S. Provisional Patent Application filed on Apr. 8, 2005, having a Ser. No. 60/669,722, and further claims priority as a continuation-in-part of U.S. Utility Application filed on Jun. 27, 2005, having a Ser. No. 11/167,358, all of which are incorporated herein by reference for all purposes.

BACKGROUND

1. Technical Field

The present invention relates to wireless communications and, more particularly, to circuitry for distributing a local oscillation.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

In some applications or designs, buffers are often used to distribute a specified signal in a manner that maintains signal quality (power, peak value, etc.). One problem, though, is that the buffers often are made as simple amplification stages to reduce circuit real estate but face problems due to loading in an output stage of the buffer. For example, in a buffer that comprises an inductor as a load, a large inductor that provides desired gain response at a specified frequency can be undesirable because of the size of required integrated circuit real estate. This problem is especially acute in a circuit having a distributed local oscillation path requiring many such buffers. A need exists, therefore, for a buffer that provides adequate gain while reducing the sizing of components such as inductors or resistors used in an output stage of the buffer.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 6 illustrates another embodiment of the invention;

FIG. 7 illustrates another embodiment of the invention;

DETAILED DESCRIPTION OF THE DRAWINGS

Figure 1:
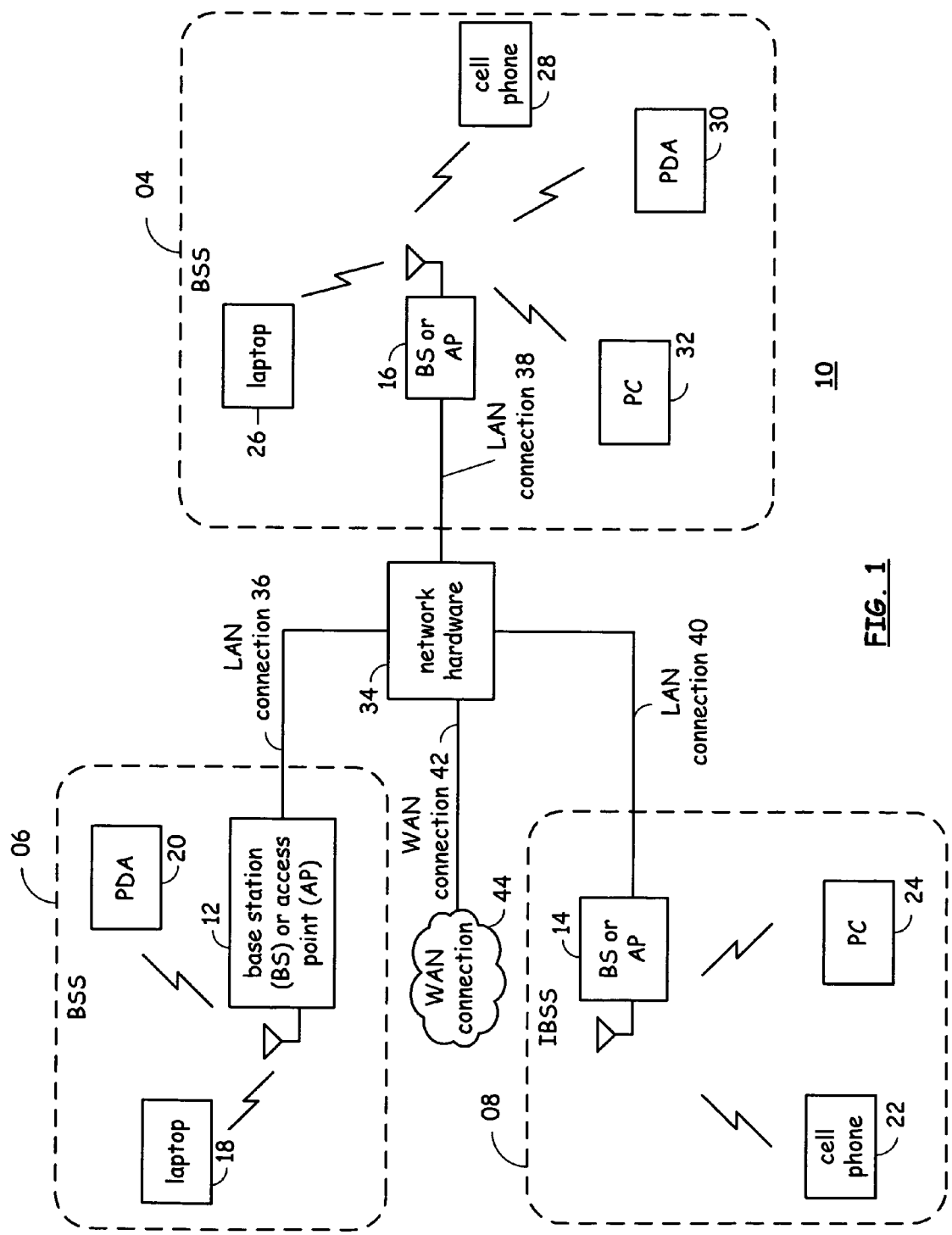
FIG. 1 is a functional block diagram illustrating a communication system that includes a plurality of base stations or access points (APs), a plurality of wireless communication devices and a network hardware component.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10 to an external network element. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
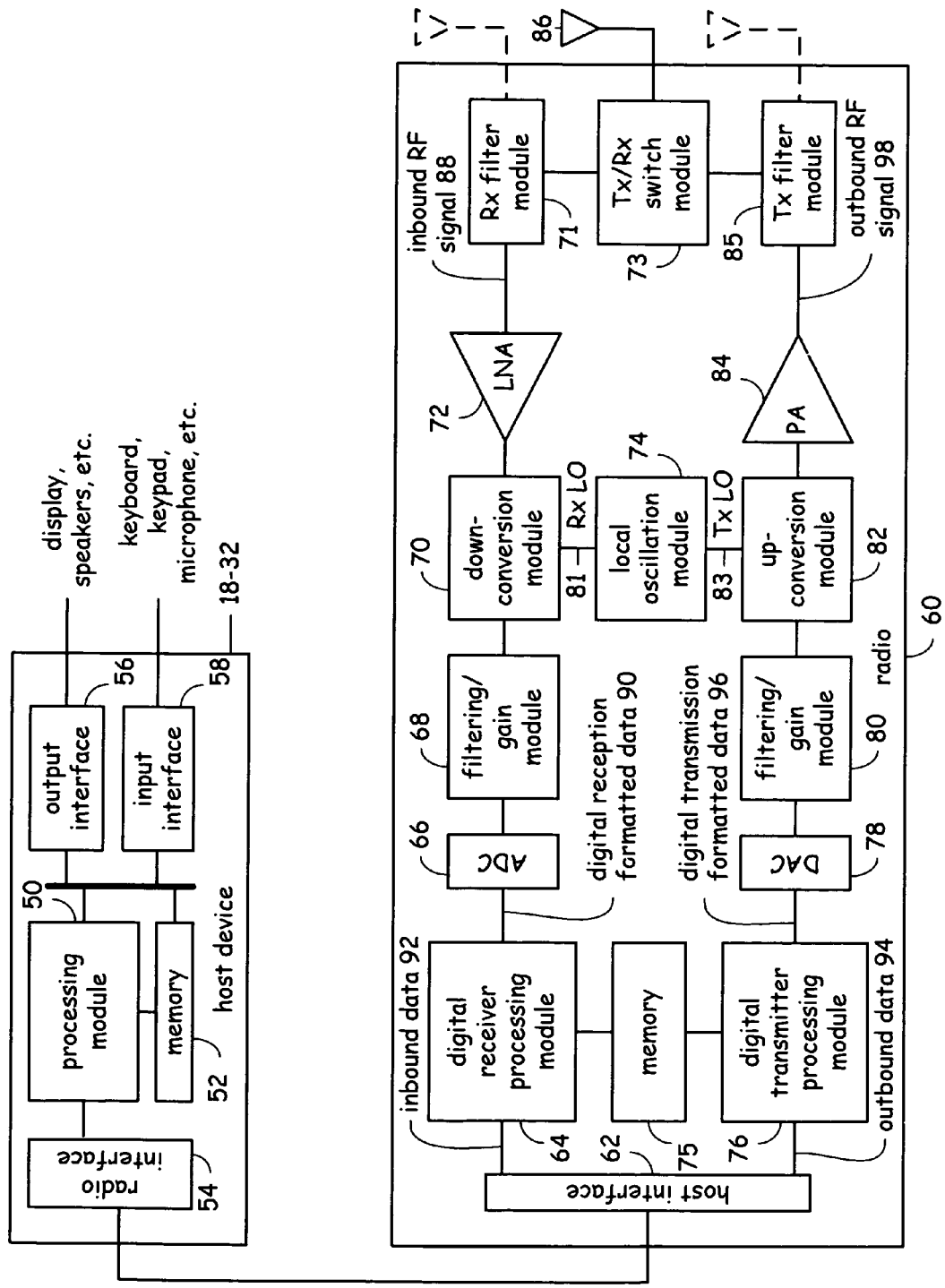
FIG. 2 is a schematic block diagram illustrating a radio frequency (RF) transmitter architecture including a baseband processor and a radio processor according to one embodiment of the present invention.

FIG. 2 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
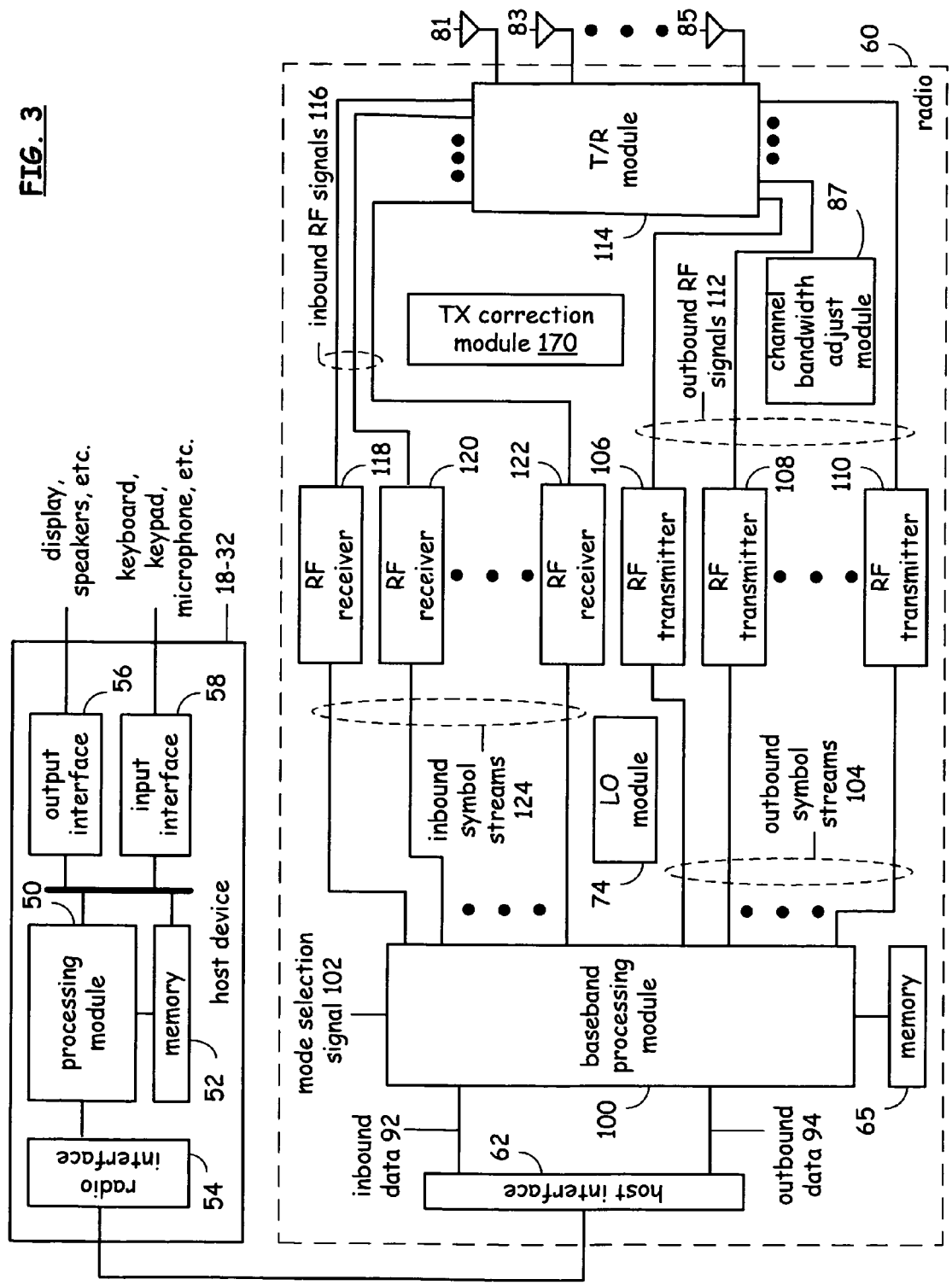
FIG. 3 is a schematic block diagram illustrating a wireless communication device that includes a host device and an associated radio.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122, which will be described in greater detail with reference to FIG. 4. The RF receiver 118-122, converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
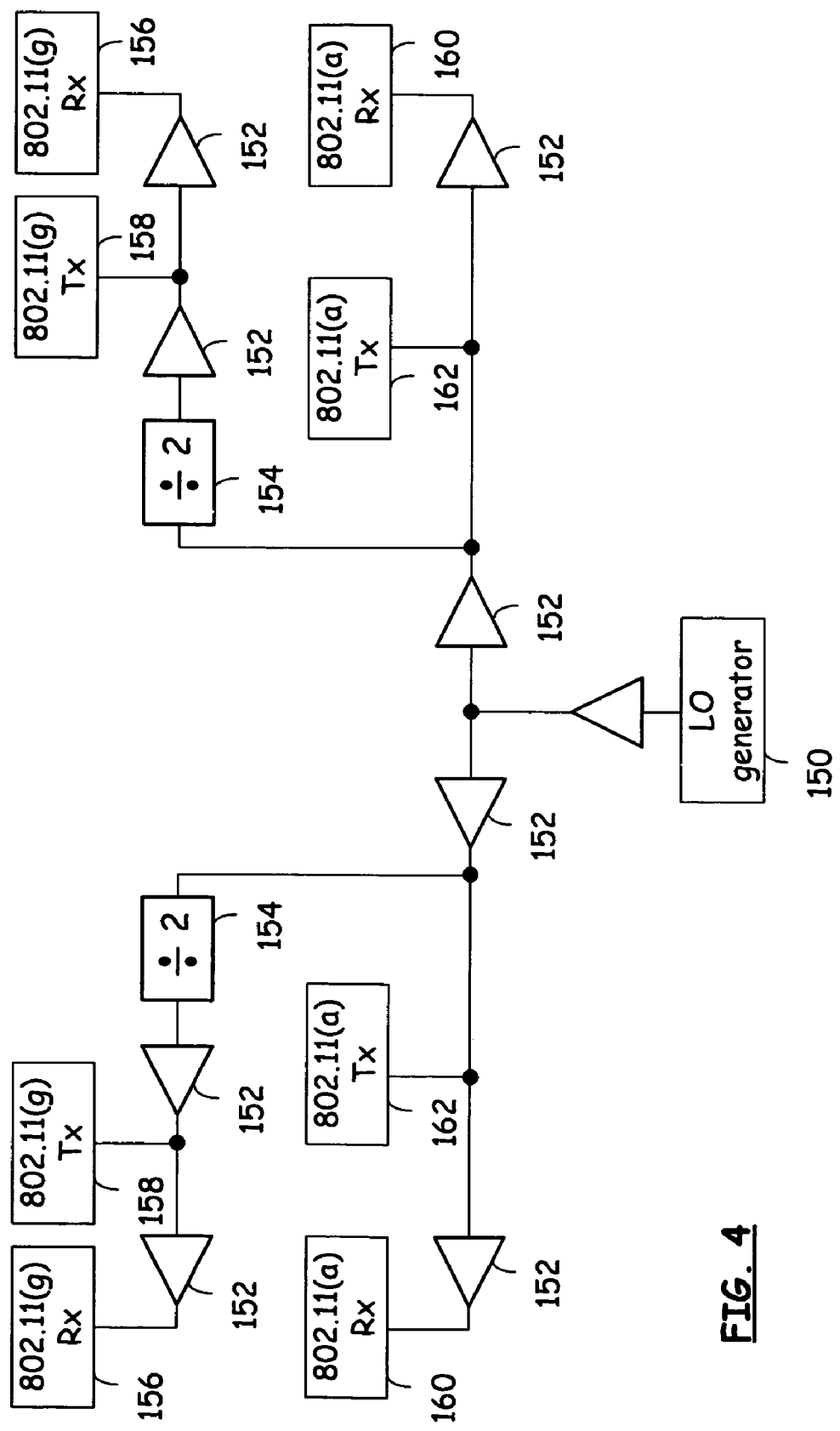
FIG. 4 is a functional block diagram of a circuit for distributing a local oscillation to a plurality of receive and transmit radio front end circuit blocks according to one embodiment of the invention.

FIG. 4 is a functional block diagram of a circuit for distributing a local oscillation to a plurality of receive and transmit radio front end circuit blocks according to one embodiment of the invention. The circuit of FIG. 4 may readily be implemented in any one of a plurality of radio circuit configurations including integrated circuit radio transceivers. Referring now to FIG. 4, local oscillation (LO) generator 150 produces an oscillation to a plurality of buffers 152 either directly or indirectly. As may further be seen from the circuit of FIG. 4, the embodiment of the integrated circuit radio transceiver includes transmit radio front end circuit blocks and receive radio front end circuit blocks that operate according to one of a plurality of communication protocols or operating standards including 802.11(g) and 802.11(a). While the specific embodiment of the invention includes these two operating standards, it is understood that the teachings of the present specification may be applied to any combination of protocols or standards including Bluetooth that may be used in a similar and substantially equivalent circuit. Moreover, the teachings may be applied to radio transceivers that operate according to only one communication protocol or standard.

One point to observe about the circuit of FIG. 4 is that one group of radio front end circuit blocks require a divided local oscillation in relation to the oscillation produced by the LO generator 150. For example, 802.11(a) radios operate at a radio frequency that is twice that of 802.11(g) radios. The circuit for distributing a local oscillation of FIG. 4 includes, therefore, a pair of divide by two blocks 154 that are operable to reduce the local oscillation frequency by a factor of two. It is readily understood that any divide block may be used to divide by any integer or non-integer number according to design considerations. As may further be seen in the circuit of FIG. 4, an output buffer or buffering element 152 is coupled to an input of a radio front end circuit block or a divide by two block.

In the specific example of FIG. 4, a pair of buffers 152 is provided for buffering an input signal to two 802.11(g) receive radio front end circuit blocks 156 and transmit radio front end circuit blocks 158. Similarly, a pair of buffers 152 is provided for buffering an input signal to two 802.11(a) receive radio front end circuit blocks 160 and transmit radio front end circuit blocks 162.

In operation, the circuit of FIG. 4 is operable to generate and distribute a local oscillation or a divided oscillation to (four) receive radio front end circuit blocks 156, 160 and to (four) transmit radio front end circuit blocks 158, 162.

Because the circuit of FIG. 4 is for the distribution of a local oscillation and is part of a local oscillation circuit path, impedance matching is not a large concern. Generally, however, it is desirable to provide a buffered oscillation at the input of each circuit block to facilitate consistent and predictable circuit operation. A challenge, however, is to provide buffers that minimize required integrated circuit footprints while operating within certain design parameters. For example, many buffers include an inductor as a load device. As one of average skill in the art can readily appreciate, use of a large inductor provides higher gain and a sharper response at a frequency of interest. It is advantageous, however, to reduce the size of an inductor to reduce the IC real estate required within the integrated circuit for twenty inductors that are required for each of ten buffers shown in the embodiment of FIG. 4.

As will be shown in greater detail below, therefore, a buffer may be formed within the circuit of FIG. 4 that utilizes a smaller inductor than would ordinarily be required wherein a gain stage of the buffer is formed according to one embodiment of the invention that compensates for reduced performance that results from using a smaller inductor. For example, it is known that a smaller inductor will typically provide a flatter frequency response at a specified frequency of interest. A buffer according to the described embodiments of the invention, however, provides circuitry that compensates for the flatter response of the smaller inductor at a desired frequency. As will be shown in greater detail below, a selectable capacitance is placed in a feed forward circuit path that generates a negative resistance which serves to increase gain at a specified frequency of interest.

Figure 5:
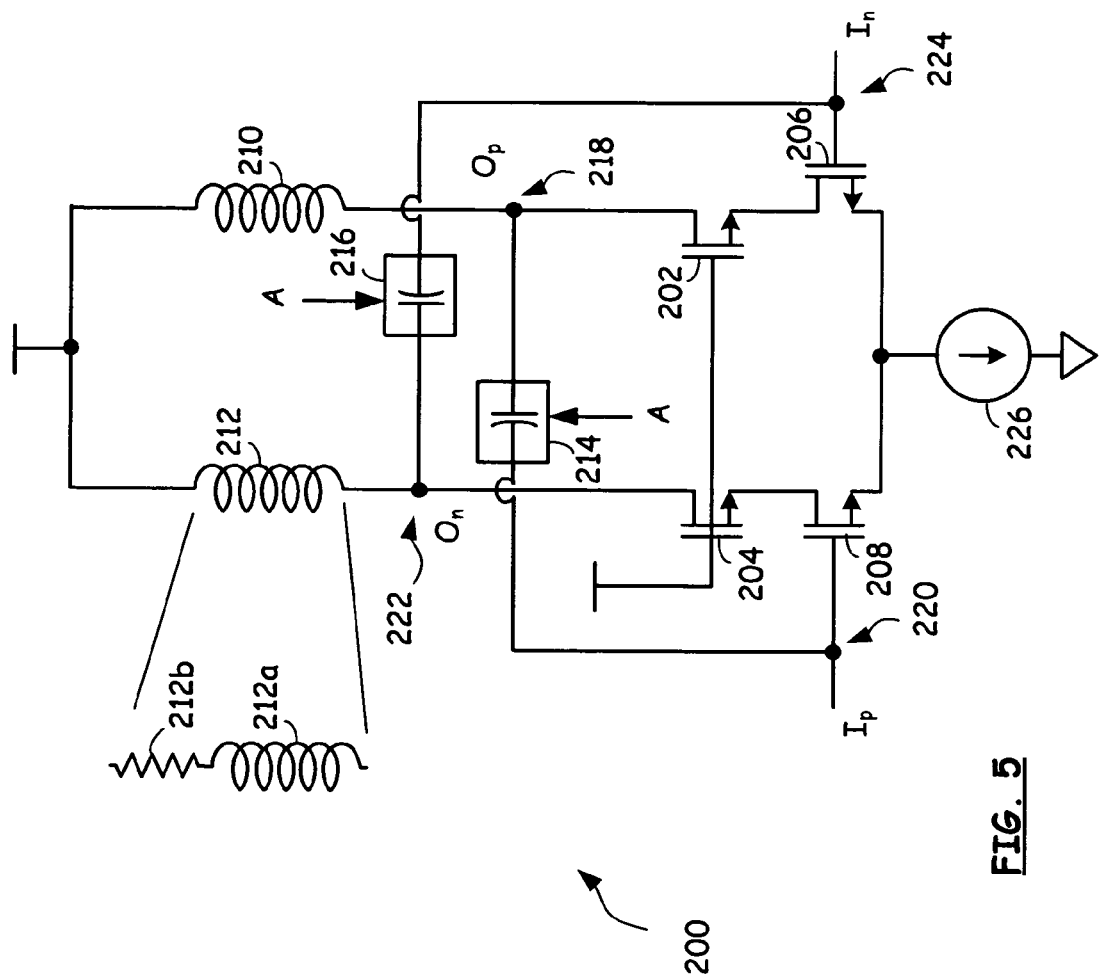
FIG. 5 illustrates a schematic circuit diagram of one embodiment of the invention in which cross-coupled capacitors or capacitive elements are used for gain boosting a radio frequency (RF) amplifier stage or stages.

FIG. 5 illustrates a schematic circuit diagram of one embodiment of the invention in which cross-coupled capacitors or capacitive elements are used for gain boosting a radio frequency (RF) amplifier stage or stages. A reference herein to a capacitive element includes single capacitors, a plurality of coupled capacitors in which at least one is selectable, and to devices such as MOSFETs that are operably configured to operate as a capacitor. An RF amplifier stage 200 of a buffer 152 in a local oscillation circuit path, according to the described embodiment of the invention, is shown having a plurality of transistors 202, 204, 206 and 208. In the particular embodiment shown, transistors 202-208 are disposed in a cascode arrangement, so that amplifier stage 200 operates as a differential cascode amplifier. Transistors 206, 208 are input transistors for respective differential input signals, shown as In (negative differential input) and Ip (positive differential input). The differential input signals are coupled to gates of transistors 206, 208 at input node 224 for In and at input node 220 for Ip. Differential output signals (Op and On) are obtained at corresponding output nodes 218, 222.

Transistors 202 and 204 are cascode transistors, having their gates coupled to a reference bias voltage, which may be a supply voltage. Transistors 202, 206 are arranged serially between output node 218 and a common leg of the differential stage that is coupled to a supply node, which in this instance is current sink 226 that is operable to provide a voltage drop at the source terminals of transistors 206 and 208 to provide bias. Transistors 204, 208 are arranged serially between output node 222 and current sink 226. In the particular embodiment shown in FIG. 5, transistors 202-208 are n-type MOSFET transistors, so that the sources of transistors 206, 208 are coupled to the common leg, and output nodes 218, 222 are obtained at the drains of respective transistors 202, 204. It is to be noted that an equivalent circuit may be designed using p-type transistors.

Amplifier stage 200 also includes inductive loads coupled to the output nodes 218, 222. A variety of inductive loads may be used. In the particular embodiment shown, inductors 210, 212 form the inductive loads for amplifier stage 200. Inductors 210, 212 may form part of a tuned circuit for amplifier stage 200. The other side of inductors 210, 212 are shown coupled to a supply rail, but it is to be noted that other components may reside between inductors 210, 212 and the supply rail.

A cross-coupled capacitive element network comprised of capacitive elements 214, 216 is disposed within amplifier stage 200 to provide negative resistance in a feed-forward path. More specifically, capacitive element 214 is disposed between nodes 218 and 220. Likewise, capacitive element 216 is disposed between nodes 222 and 224. Cross-coupled capacitive elements 214, 216 function as feed-forward capacitors to provide positive gain feedback of Op to Ip and On to In. The gain boost obtained from the cross-coupling improves gain for the differential signals. This gain boost operates as though a negative resistance is introduced to offset (or to compensate) for resistance of the inductive load. That is, the result obtained is analogous to reducing the series resistance of the inductors 210, 212, which may result in a higher Q value for the amplifier stage 200. The higher Q is obtained without introducing an active device to boost the gain, since the gain boost is obtained by the passive components, in this case capacitive elements 214, 216. The gain boost may also result in increasing the rejection of the common-mode signals.

As may be seen from examining FIG. 5, an inductor, such as inductor 212, may be modeled as a combination of a resistor and inductor. Thus, an inductor 212 is represented by an inductor 212a and a resistor 212b. One purpose of providing negative resistance in a feed-forward path, therefore, is to counteract the loading provided by resistance that is inherent to an inductor and is represented by resistor 212b in FIG. 5.

The amount of the feedback in the feed-forward circuit path may vary depending on the particular circuit employed. Thus, various capacitive element sizes may be chosen. However, an important consideration is that the circuit is to operate as an amplifier and not as an oscillator in the application of the described embodiments of the invention. Since reactance is present with the inductors and capacitive elements, the cross-coupled capacitive element value is selected so that the overall loop gain is not positive. That is, the cross-coupled capacitive elements boost the gain of the stage, but the gain is limited to a value which does not completely cancel all of the resistance of the inductors. Canceling all of the inductive load resistance may cause a positive loop gain condition that may turn the amplifier stage into an oscillator. Generally, the amplifier stage is to operate as an amplifier (not as an oscillator) over its PVT (process, voltage and temperature) in the applications of the described embodiments.

Some considerations for selecting a proper capacitance value for the cross-coupled capacitive elements are: size of transistors 206, 208 and/or 202, 204; value of the inductive load (inductors 210, 212); series resistance of the inductor; trace resistance which may add to the series resistance of the inductor or load (if a resistive load is employed); amount of desired negative resistance; and output requirements for a subsequent downstream circuit that is to be driven in the next stage. One or more of these factors, as well as others which are not listed here, may play in the consideration for the value selected for capacitive elements 214 and 216.

According to one aspect of the present invention, capacitive elements 214 and 216 may comprise a bank of capacitive elements in which at least one is selectable. As is known by one of average skill in the art, the capacitance of parallel coupled capacitive elements may be summed to determine a total capacitance value. Thus, in one embodiment of the present invention, a capacitor bank used to form capacitive element 214 or 216 includes a plurality of selectable capacitive elements that may be switched in or out of a parallel coupling based upon received control signals to adjust or tune the response of an amplifier stage such as amplifier stage 200. Increasing total capacitance in the feed-forward path improves gain (and negative resistance) at a specified frequency. In one embodiment of the present invention, the control signal or signals that are used to adjust the capacitance by selecting capacitive elements for coupling or decoupling is produced by a processor such as a radio transceiver baseband processor. In an alternate embodiment of the present invention, the control signal may be generated by a state logic or field programmable gate array logic.

It is to be noted that another embodiment of the invention is to employ amplifier stage 200 without the use of cascode transistors 202, 204. In that embodiment, output nodes 218, 222 may be obtained at the respective drains of the input transistors 206, 208. Although this design may be operative as an amplifier stage, the presence of cascode transistors 202, 204 improves performance of the stage.

As mentioned above, amplifier stage 200 includes a current source 226 introduced in the common leg (here, the commonly connected sources) of transistors 206, 208. Whereas amplifier stage 200 may be readily used in class A, B and AB modes of operation, it may have difficulty maintaining class A operation. Current source 226 of amplifier stage 200 provides a much tighter control on the current flow to the transistors, so that class A mode of operation is readily easier to obtain. A variety of components which generally may be used to control current may be used for current source 226.

FIG. 6 illustrates another embodiment of the invention. An amplifier stage 230 of FIG. 6 is similar to amplifier stage 200 of FIG. 5 except that resistive elements 232 and 234 are placed in series with corresponding capacitive elements 214, 216. The inclusion of resistive elements 232 and 234 in the cross-coupled network in series with capacitive elements 214, 216 provides for greater size ranges of capacitance from capacitors or capacitive elements 214, 216 to provide feed-forward based negative resistance without oscillation of the amplifier stage. Instead of having just control over the capacitance, now an RC combination is available in establishing the loop gain. For example, a larger capacitance may be selected for capacitive elements 214, 216 and buffered through the resistive elements 232 and 234 to prevent the amplifier stage from entering into oscillation.

In some instances, amplifier stages 200 or 230 may be difficult to use if impedance matching is a concern. For example, if the amplifier stage is a stand alone stage or is at the beginning or end of a multiple set of amplifier stages, it may be beneficial to use amplifier stage 230 if impedance matching is needed. The degree of freedom obtained by selecting the RC combination allows impedance matching adjustments to be made, along with the gain boost.

FIG. 7 illustrates another embodiment of the invention. Amplifier stage 240 of FIG. 7 is equivalent to amplifier stage 230 of FIG. 6, except that resistors 242 and 244 are used as a load instead of inductors 210 and 212. The above described embodiments of the invention and associated operation also apply to amplifier stages used in an oscillation loop in which the load is resistive instead of inductive. The negative resistance provided in the feed forward paths also continues to improve gain at a specified frequency of operation.

Figure 8:
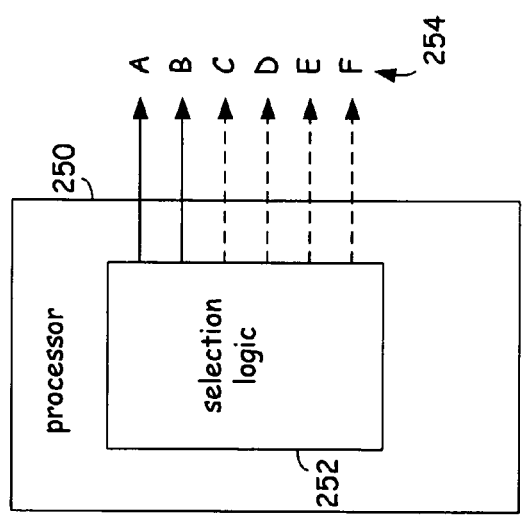
FIG. 8 is a block diagram that illustrates capacitive element and resistive element selection logic formed in a processor according to one embodiment of the present invention.

FIG. 8 is a block diagram that illustrates capacitive element and resistive element selection logic formed in a processor according to one embodiment of the present invention. More specifically, a processor 250 includes a selection logic 252 that is operable to produce control commands for selecting selectable resistors and capacitive elements according to one embodiment of the present invention. As may be seen in the specific example of FIG. 8, selection logic 252 is operable to produce a plurality of control signals A-F having independently selectable values as shown generally at 254. Specific logic for selecting capacitive and resistive elements is a function of circuit design requirements and can be determined by one of average skill in the art during the design stage of implementing the teachings of the present invention.

Figure 10:
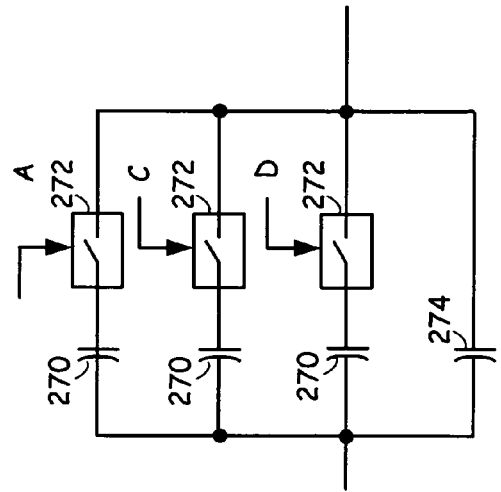
FIG. 10 illustrates a plurality of parallel coupled capacitive elements that are each coupled in series with a switch.
Figure 9:
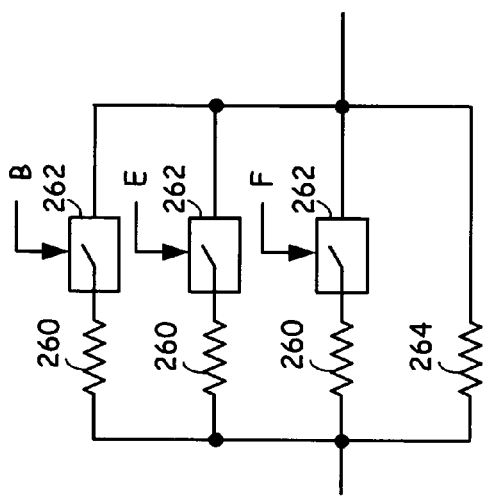
FIG. 9 is a functional schematic diagram that illustrates resistive and capacitive tuning of amplifier stages in an oscillation path according to one embodiment of the invention.

FIGS. 9 and 10 are functional schematic diagrams that illustrate resistive and capacitive tuning of amplifier stages in an oscillation path according to one embodiment of the invention. Referring now to FIGS. 9 and 10, a plurality of parallel coupled resistive and capacitive elements are shown in each of the Figures, respectively, each of the selectable resistive and capacitive elements having an associated series coupled switch that is operably coupled to receive one of control signals A-F. With respect to FIG. 9, all but one of the resistive elements are coupled in series with a switch that operatively couples the corresponding resistive element into parallel coupling with one or more other resistive elements. Specifically, each resistive element 260 is coupled in series with a switch 262. In the example shown, switches 262 are operably coupled to receive control signals B, E and F to selectively couple a corresponding resistive element 260. Additionally, a resistance element 264 is permanently coupled and is not selectable. As is known by one of average skill in the art, the selective coupling of any one of the resistive elements 260 will reduce a total resistance of the circuit of FIG. 9 because of the parallel connection of the resistors. Accordingly, the value of resistance selected for resistive element 264 is selected to be a maximum desired resistance value, wherein a total resistance value of the circuit of FIG. 9 is lowered by the coupling of one or more of the resistive elements 260.

Similarly, FIG. 10 illustrates a plurality of parallel coupled capacitive elements 270 that are each coupled in series with a switch 272. Each switch 272 is operably coupled to receive a control signal (one of A, C or D) from selection logic 252. Because capacitance is increased by the operative coupling of parallel coupled capacitive elements, a capacitance value of capacitive element 274 is selected to be a minimum desired value wherein a total capacitive value is increased by the selective coupling of one or more capacitive elements 270.

The embodiments of FIGS. 9 and 10 are functional in nature and may readily be replaced by alternate designs. For example, in an integrated circuit application, each of the switches of FIGS. 9 and 10 may comprise a MOSFET transistor that is selectively biased to open or close a connection. Similarly, the resistive and capacitive elements may also be implemented as resistor and capacitive element configured MOSFETs. Finally, processor 250 and the associated selection logic 252 may comprise a baseband processor in a radio transceiver wherein the selection logic is defined by computer instructions stored in memory. As such, the baseband processor executes the stored computer instructions to achieve the operational logic defined by the computer instructions. Alternatively, a dedicated processing device may be utilized to generate the control signals A-F. In yet another alternate embodiment, the selection logic that generates the control signals may be replaced by dedicated state logic or by programmable logic such as field programmable gate arrays.

Each of the circuits of FIGS. 9 and 10 may be used in place of a single resistive or capacitive element of the feed-forward circuit paths between the differential input and output nodes described in relation to what is shown in FIGS. 5, 6 and 7.

Figure 11:
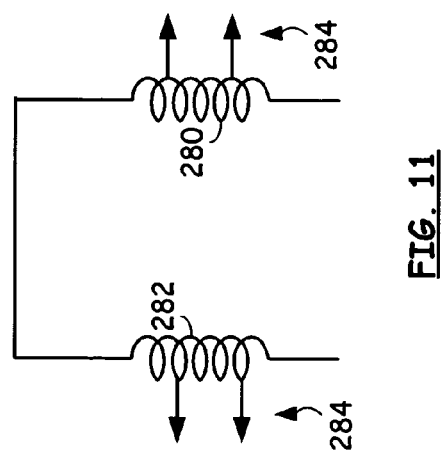
FIG. 11 is a functional circuit diagram that illustrates one embodiment of inductive load devices utilized within an embodiment of a buffering element.

FIG. 11 is a functional circuit diagram that illustrates one embodiment of inductive load devices utilized within an embodiment of a buffering element. Specifically, as may be seen, inductors 210 and 212 of the previously described embodiments are replaced by inductors 280 and 282, respectively. Each of the inductors 280 and 282 include selective inductive values. In the described embodiment, inductors 280 and 282 include tap points shown generally at 284 that allow tapping into a node disposed within the inductor to allow an operator or circuit to selectively specify an inductive value. Such selectivity is desirable for many reasons, including tuning a response or gain of an amplifier within a buffer. Inductors 280 and 282 may used in place of inductors 210 and 212 in each illustrated embodiment, including the embodiment of FIG. 12 as described below.

Figure 12:
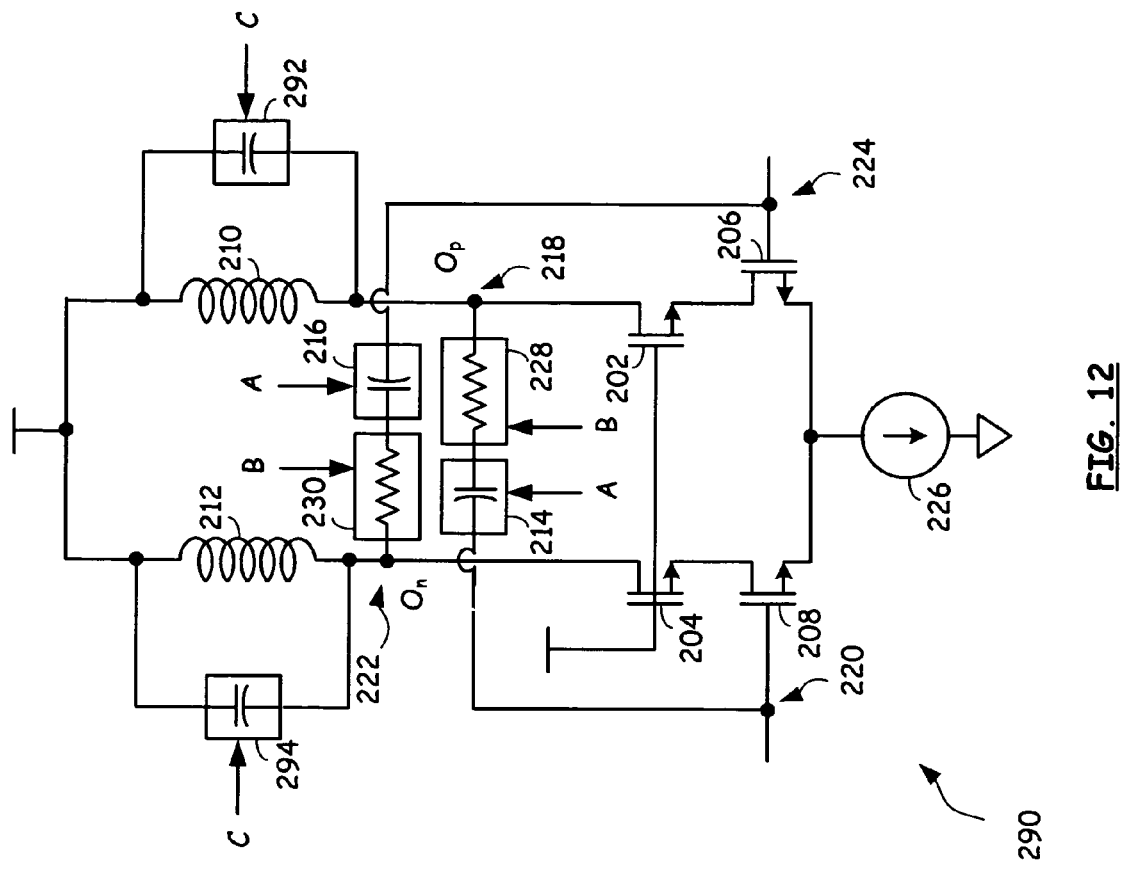
FIG. 12 illustrates one embodiment of an inductive load in which a tunable tank is utilized as a load device in place of inductors.

FIG. 12 illustrates one embodiment of an inductive load in which a tunable tank is utilized as a load device in place of inductors 210 and 212. Specifically, an amplifier stage 290 includes many common circuit elements as previously described in addition to inductors 210 and 212 as previously described. Additionally, amplifier stage 290 includes selectable capacitive elements 292 and 294 across inductors 210 and 212 as shown in FIG. 11. Operation of the selectable capacitive elements 292 and 294 is similar to operation as described in relation to elements 214, 216 and, in at least one embodiment, to operation of the circuit of FIG. 10.

Generally, a tank formed by the capacitors and tunable inductors coupled between a supply and the drain terminals (amplifier output terminals) of MOSFETs 202 and 204, as shown in FIG. 11, is operable to tune a buffer or amplification stage to a specified frequency band with a specified peak center frequency. Thus, having a selectable degenerated positive feedback circuit path provides selectable negative resistance is particularly advantageous when a tunable tank or load is utilized, as shown in FIGS. 11 and 12, to allow selection of an optimal feed-forward negative resistance in relation to the frequency response of the load devices. Because the tank or load is tunable in the embodiments of FIGS. 11 and 12, the optimal amount of feed forward or negative resistance changes according to the selected load parameters. Thus, in this described embodiment of FIG. 12, for example, the selection of capacitive elements through a control signal A is related to and corresponds to the selection of capacitive elements through a control signal C as shown in FIG. 11.

In one embodiment, a processor similar to processor 250 with selection logic 252 is operable to select the capacitive elements with control signals A and C. One of average skill in the art may readily determine the values and types of control signals A and C used to select the corresponding capacitive value to provide an optimal feed-forward negative resistance based upon a selected capacitance of a tank as shown in FIG. 11, or a selective inductance as illustrated with an inductive element having selectable inductive values as shown in FIG. 10. It is understood that using selectable inductive and capacitive values and devices providing the same may readily be used in place of inductors 210 and 212 of the various embodiments of the invention.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A multi-band integrated circuit radio transceiver, comprising:
   a plurality of receive and transmit radio front end circuit blocks for processing ingoing and outgoing communication signals, respectively;
   a local oscillation generator for generating a local oscillation for use by the plurality of receive and transmit radio front end circuit blocks to down convert received RF signals to baseband or low intermediate frequency signals and for use by the plurality of receive and transmit radio front end circuit blocks to up-convert outgoing communication signals to RF, respectively;
   at least one buffering element coupled between the local oscillation generator and at least one front end circuit block, which at least one buffering element produces a buffered oscillation based upon the local oscillation to the at least one front end circuit block; and
   wherein the at least one buffering element includes:
      a differentially arranged amplifier stage having an inductive load operably coupled to an output node of the amplifier stage, the inductive load further including a selectable element to adjust a frequency of operation; and
      a cross-coupled capacitive element coupled between an input node and the output node of the amplifier stage, the cross-coupled capacitive element having at least one selectable capacitive element.

2. The multi-band integrated circuit radio transceiver of claim 1 further including a plurality of cross-coupled capacitive elements coupled between input and output nodes of the amplifier stage.

3. The multi-band integrated circuit radio transceiver of claim 2 wherein at least one of the plurality of cross-coupled capacitive elements is selectable.

4. The multi-band integrated circuit radio transceiver of claim 3 further including selection logic for selecting one or more capacitive elements of the selectable cross-coupled capacitive elements to improve gain of the at least one buffering element at a specified frequency of operation and further including at least one selectable element of the inductive load and selection logic for selecting the at least one selectable element.

5. The multi-band integrated circuit radio transceiver of claim 4 wherein the at least one selectable element of the inductive load comprises at least one of a selectable capacitive element and an inductive element comprising selectable inductive values.

6. The multi-band integrated circuit radio transceiver of claim 5 wherein the selection logic is defined by a state logic block, which state logic block generates control signals to select one or more capacitive elements of the selectable cross-coupled capacitive elements.

7. The multi-band integrated circuit radio transceiver of claim 5 further including a resistive element coupled in series with at least one cross-coupled capacitive element wherein the resistive element and at least one cross-coupled capacitive element are operable to provide negative resistance in a feed-forward circuit path formed between the input and output nodes of the amplifier stage.

8. The multi-band integrated circuit radio transceiver of claim 7 wherein the state logic block is operable to select one or more capacitive elements of the selectable cross-coupled capacitive elements to substantially but not completely cancel resistance of the inductive load.

9. The multi-band integrated circuit radio transceiver of claim 7 wherein the resistive element includes at least one selectable resistive element and further wherein the selection logic is operable to generate control commands for selecting at least one selectable resistive element.

10. A multi-band integrated circuit radio transceiver, comprising:
- a plurality of receive and transmit radio front end circuit blocks for processing ingoing and outgoing communication signals, respectively;
- a local oscillation generator for generating a local oscillation for use by the plurality of receive and transmit radio front end circuit blocks to down convert received RF signals to baseband or low intermediate frequency signals and for use by the plurality of receive and transmit radio front end circuit blocks to up-convert outgoing communication signals to RF, respectively;
- at least one buffering element coupled between the local oscillation generator and at least one front end circuit block, which at least one buffering element produces a buffered oscillation based upon the local oscillation to the at least one front end circuit block; and
- wherein the at least one buffering element includes:
  - a differentially arranged amplifier stage having a resistive load; and
  - a cross-coupled capacitive element coupled between input and output nodes of the amplifier stage.

11. The multi-band integrated circuit radio transceiver of claim 10 further including a plurality of cross-coupled capacitive elements coupled between input and output nodes of the amplifier stage.

12. The multi-band integrated circuit radio transceiver of claim 11 wherein at least one of the plurality of cross-coupled capacitive elements is selectable.

13. The multi-band integrated circuit radio transceiver of claim 12 further including selection logic for selecting one or more capacitive elements of the selectable cross-coupled capacitive elements to improve gain of the at least one buffering element at a specified frequency of operation.

14. The multi-band integrated circuit radio transceiver of claim 13 wherein the selection logic is defined within a processor block, which processor block generates control signals to select one or more capacitive elements of the selectable cross-coupled capacitive elements.

15. The multi-band integrated circuit radio transceiver of claim 13 wherein the selection logic is defined by a state logic block, which state logic block generates control signals to select one or more capacitive elements of the selectable cross-coupled capacitive elements.

16. The multi-band integrated circuit radio transceiver of claim 14 further including a resistive element coupled in series with at least one cross-coupled capacitive element wherein the resistive element and at least one cross-coupled capacitive element are operable to provide negative resistance in a feed-forward circuit path formed between the input and output nodes of the amplifier stage.

17. The multi-band integrated circuit radio transceiver of claim 16 wherein the state logic block is operable to select one or more capacitive elements of the selectable cross-coupled capacitive elements to substantially but not completely cancel resistance of the resistive load.

18. The multi-band integrated circuit radio transceiver of claim 16 wherein the resistive element includes at least one selectable resistive element and further wherein the selection logic is operable to generate control commands for selecting at least one selectable resistive element.

19. A buffering element, comprising:
- a differentially arranged amplifier stage;
- a cross-coupled first capacitive element bank coupled between input and output nodes of the amplifier stage; and
- a cross-coupled resistive element coupled between the input and output nodes of the amplifier stage;
- an inductive device operably disposed between a supply and the output node of the amplifier stage;
- a second capacitive element bank operably disposed across the inductive device forming a tunable tank with the inductive device; and
- wherein the buffering element is operable to receive control commands to operably select at least one selectable capacitive element of the cross-coupled first capacitive element bank to adjust gain of the amplifier stage by increasing negative resistance provided to the input nodes of the buffering element and further operable to receive control commands to operably select at least one capacitive element of the second capacitive bank to tune the tank comprising the second capacitive bank and the inductive device.

20. The buffering element of claim 19 wherein the cross-coupled resistive element includes at least one selectable resistive element to increase negative resistance provided to the input nodes of the buffering element and to increase the gain of the amplifier stage.

* * * * *